United States Patent
Lu (10) Patent No.: US 8,254,094 B2
(45) Date of Patent: Aug. 28, 2012

(54) PROTECTION MECHANISM AND ELECTRONIC DEVICE EMPLOYING THE SAME

(75) Inventor: Chi-Chung Lu, Tu-Cheng (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 216 days.

(21) Appl. No.: 12/813,614

(22) Filed: Jun. 11, 2010

(65) Prior Publication Data

US 2011/0188181 A1 Aug. 4, 2011

(30) Foreign Application Priority Data

Feb. 4, 2010 (TW) .............................. 99103370 A (51) Int. Cl.
*G06F 1/16* (2006.01)

(52) U.S. Cl. .............................. 361/679.01; 361/679.58

(58) Field of Classification Search ............. 361/679.01, 361/679.55, 679.58; 312/223.2
See application file for complete search history.

(56) References Cited

U.S. PATENT DOCUMENTS

| | | | | | |
|---|---|---|---|---|---|
| 4,918,632 | A | * | 4/1990 | York .......................... 361/679.09 |
| 5,100,098 | A | * | 3/1992 | Hawkins ..................... 248/291.1 |
| 5,105,335 | A | * | 4/1992 | Honda ....................... 361/679.01 |
| 5,405,000 | A | * | 4/1995 | Hagedon et al. ............... 206/216 |
| 5,586,002 | A | * | 12/1996 | Notarianni ................ 361/679.26 |
| 5,743,606 | A | * | 4/1998 | Scholder ..................... 312/223.2 |
| 5,825,874 | A | * | 10/1998 | Humphreys et al. .......... 379/446 |
| 6,040,572 | A | * | 3/2000 | Khovaylo et al. ............. 250/235 |
| 6,172,360 | B1 | * | 1/2001 | Khovaylo et al. ............. 250/235 |
| 6,301,098 | B1 | * | 10/2001 | Kim ........................ 361/679.55 |
| 6,356,440 | B2 | * | 3/2002 | Selker ....................... 361/679.55 |
| 6,362,975 | B1 | * | 3/2002 | Liu et al. ....................... 361/796 |
| 6,381,138 | B1 | * | 4/2002 | Chen ............................. 361/724 |
| 6,848,662 | B2 | * | 2/2005 | Paramonoff et al. ....... 248/309.1 |
| 7,420,812 | B2 | * | 9/2008 | Chen et al. ..................... 361/724 |

* cited by examiner

*Primary Examiner* — Lisa Lea Edmonds (74) *Attorney, Agent, or Firm* — Altis Law Group, Inc.

(57) ABSTRACT

A protection mechanism used for in an electronic device includes a main body and two pivoting members. The main body is capable of receiving and protecting the electronic device, and the pivoting members are rotatably positioned on the main body. The pivoting members are capable of locking and protecting the electronic device. An electronic device employing the protection mechanism is also described. The protection mechanism can simply secure and unlock the electronic device through the pivoting members, which is easy to operate. Moreover, the electronic device can not fall from the protection mechanism because of the cooperation between the pivoting members and the holding member.

20 Claims, 8 Drawing Sheets

PROTECTION MECHANISM AND ELECTRONIC DEVICE EMPLOYING THE SAME

BACKGROUND

1. Technical Field

The disclosure generally relates to protection mechanisms, and particularly, to a protection mechanism used in an electronic device.

2. Description of the Related Art

Generally, different protection mechanisms are used to prevent mobile phones, personal digital assistants (PDAs) or other electronic devices, from damage and impact. However, a typical protection mechanism normally cannot secure the electronic device firmly, in fact the electronic device may fall from the protection mechanism, which may cause damage to the electronic device, affecting its appearance and the performance.

Therefore, there is room for improvement within the art.

BRIEF DESCRIPTION OF THE DRAWINGS

Many aspects of an exemplary protection mechanism and an electronic device employing the same can be better understood with reference to the following drawings. The components in the drawings are not necessarily drawn to scale, the emphasis instead being placed upon clearly illustrating the principles of the exemplary protection mechanism and the electronic device employing the same. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
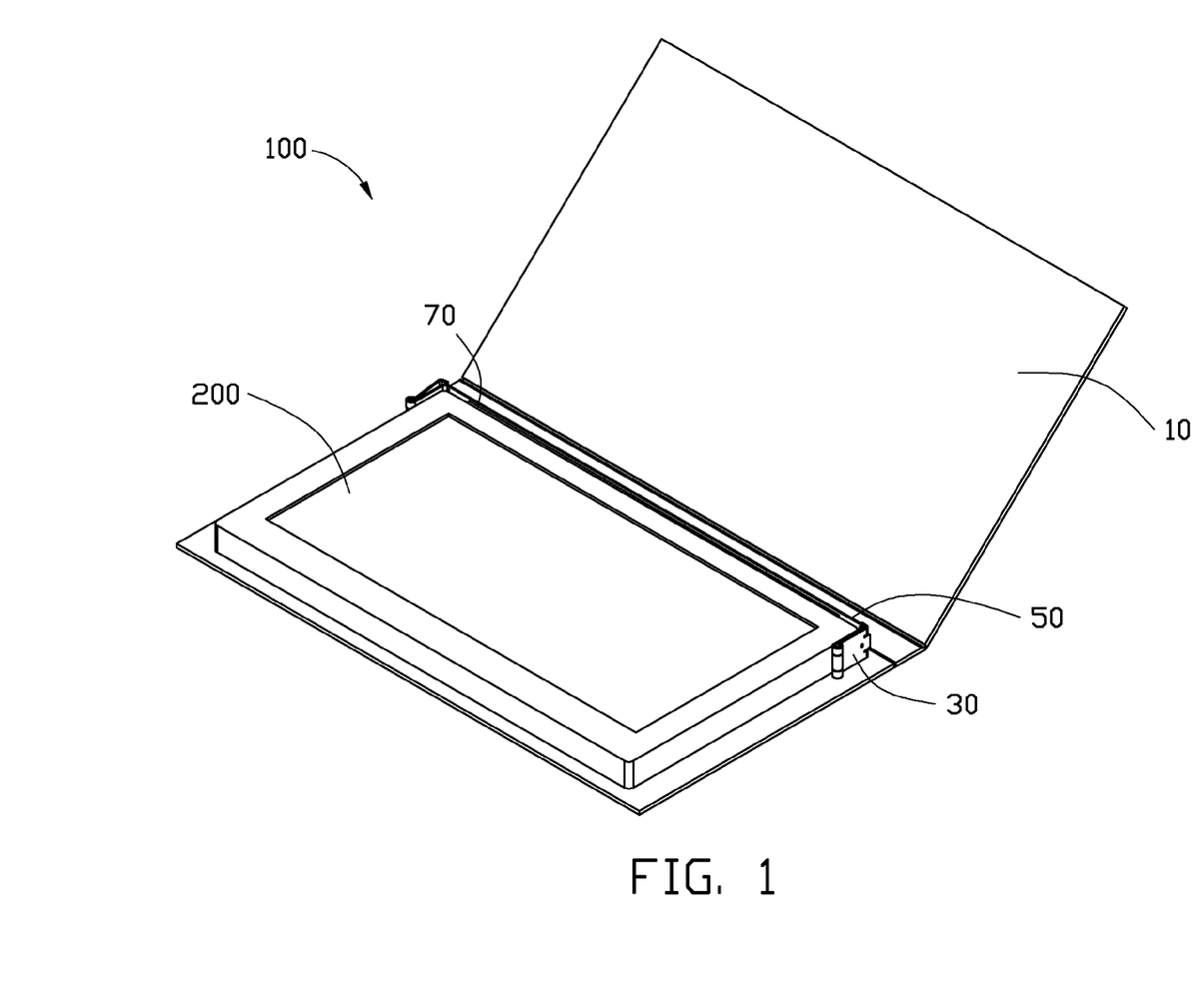
FIG. 1 is a schematic view of a protection mechanism in an open state, exposing an electronic device, according to an exemplary embodiment.
Figure 2:
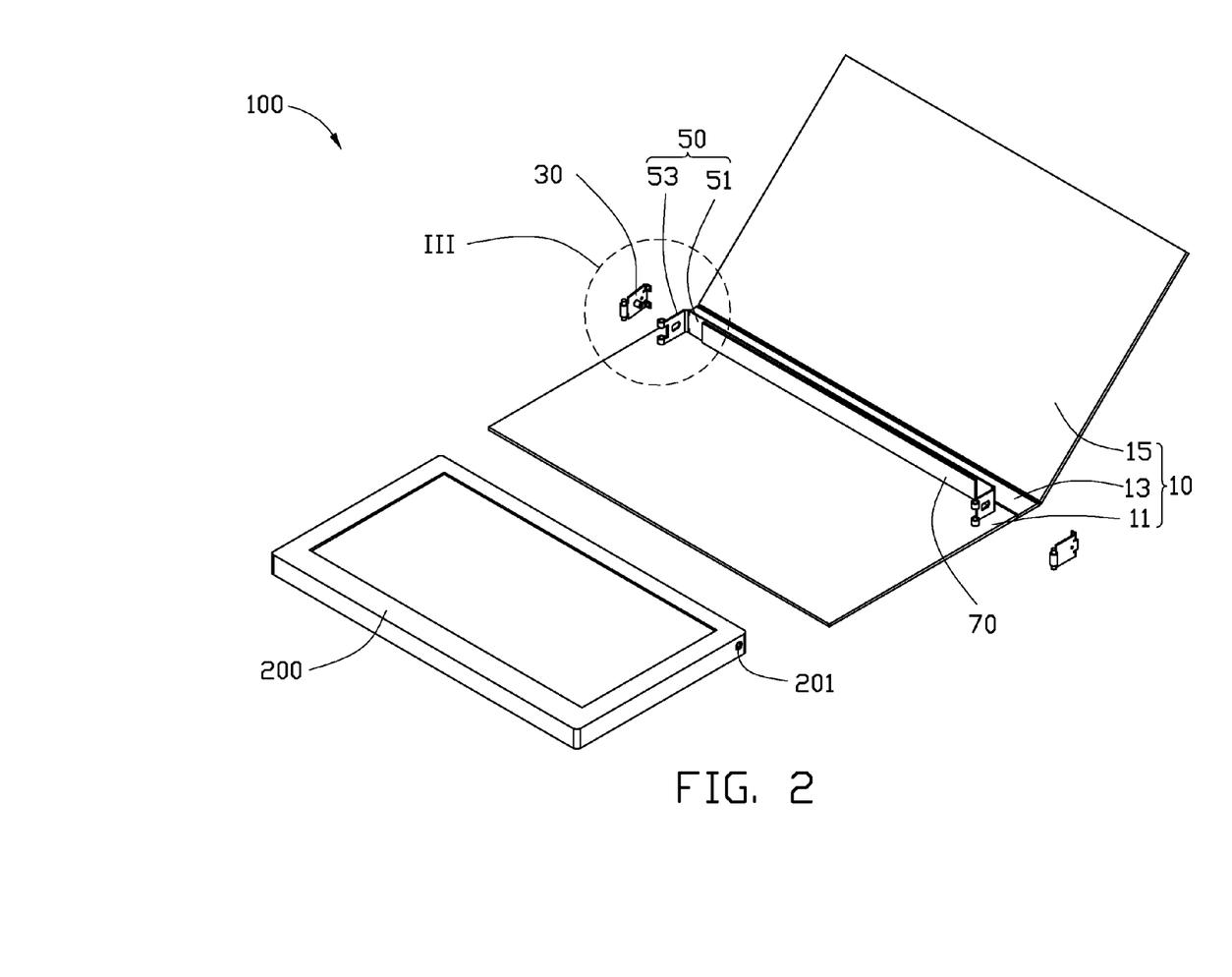
FIG. 2 is a partially exploded view of the protection mechanism shown in FIG. 1.

Referring to the drawings, FIGS. 1 and 2 show an exemplary embodiment of a protection mechanism 100 used for an electronic device 200, which may be a PDA, or a mobile phone. The protection mechanism 100 is capable of securing the electronic device 200 to avoid damage and includes a main body 10, two pivoting members 30, a holding member 50, and a cushion member 70.

The main body 10 can be made from plastic, which has impact-resistant capabilities to protect the electronic device 200 from impact. The main body 10 includes a first cover 11, a connecting sheet 13, and a second cover 15. The first cover 11 is a substantially flat and rectangular sheet, and its size is larger than the size of the electronic device 200. The connecting sheet 13 is a substantially flat and rectangular sheet, and its width is wider than the thickness of the electronic device 200. The second cover 15 has the same substantial size and shape as the first cover 11, the first cover 11 and the second cover 15 are rotatably connected to the opposite sides of the connecting sheet 13, so that the second cover 15 can close or open from the first cover 11.

Figure 3:
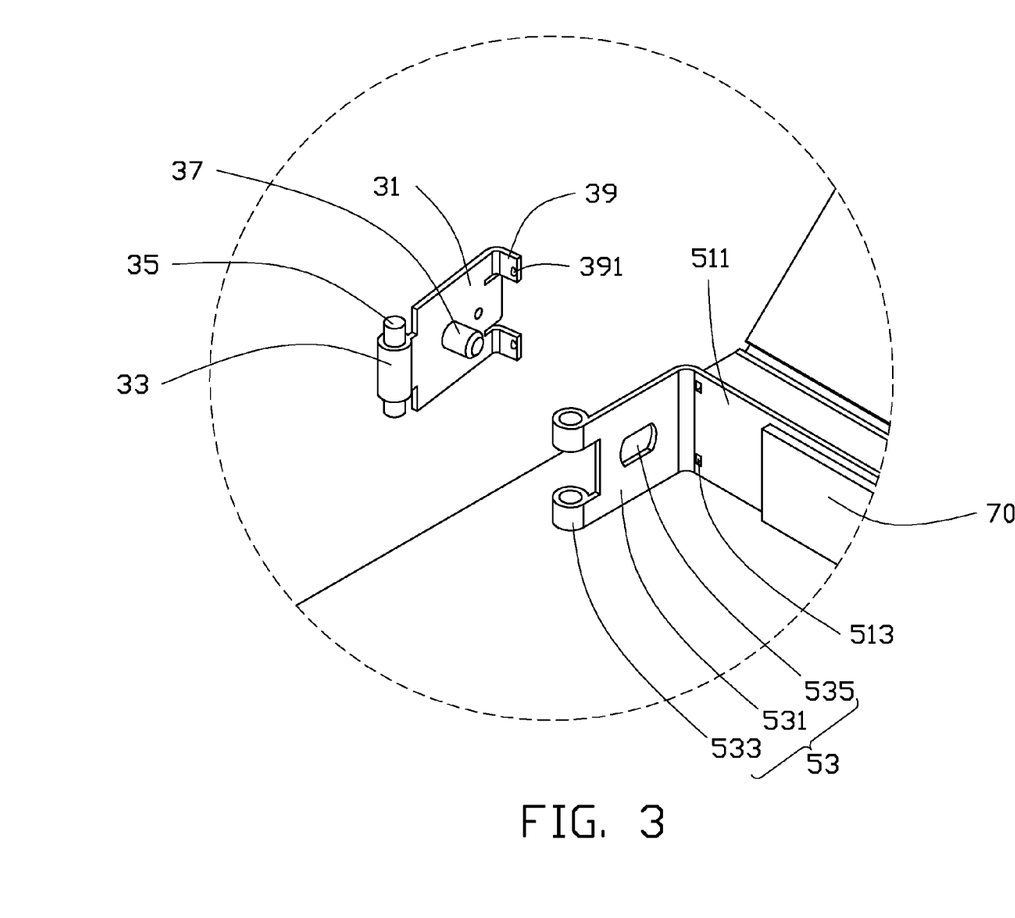
FIG. 3 is an enlarged view of a circled portion III shown in FIG. 2.

Also referring to FIG. 3, the pivoting members 30 are matchable with and are mounted to the holding member 50 to assemble and secure the electronic device 200 to the protection mechanism 100. The pivoting members 30 can be made from stainless steel, copper or other metal. Each pivoting member 30 includes a base section 31, a hinge housing 33, a connecting pin 35, a locking section 37, and two fixing blocks 39. The base section 31 is substantially flat and a substantially rectangular sheet. The hinge housing 33 is a substantial hollow cylinder and is positioned at a side of the base section 31.

The connecting pin 35 is substantially cylindrical shape, and its outer diameter is substantially equal to the inner diameter of the hinge housing 33. The connecting pin 35 can be rotatably installed within the hinge housing 33, and its opposite ends are exposed from the hinge housing 33. The locking section 37 is substantially cylindrical shape and perpendicularly protrudes from the surface of the base section 31. The fixing blocks 39 are opposite to the hinge housing 33 and may be formed by deforming another side of the base section 31, and the fixing blocks 39 and the locking section 37 are located at same surface of the base section 31. Each fixing block 39 includes a protrusion 391 protruding from the surface of the fixing block 39; the protrusions 391 are capable of locking the pivoting member 30 to the holding member 50.

The holding member 50 can be made from stainless steel, copper or other metals and formed by punching and/or deforming a piece of metal. The holding member 50 is substantially perpendicularly positioned on the first cover 11 and adjacent to the connecting sheet 13 to secure the electronic device 200. The holding member 50 includes a body sheet 51 and two assembling sections 53 substantially perpendicularly connected to opposite ends of the body sheet 51. The body sheet 51 is a substantially flat and rectangular sheet and includes an assembling surface 511. The body sheet 51 defines a plurality of fixing holes 513 located at opposite ends of the body sheet 51; the fixing holes 513 are capable of receiving the protrusions 391. In this exemplary embodiment, the number of the fixing holes 513 is four and corresponds with the number of the protrusions 391. Thus, two fixing holes 513 are located at each end of the body sheet 51.

The pivoting members 30 are rotatably positioned on the corresponding assembling sections 53. Each assembling section 53 includes a base sheet 531, an connecting portion 533 located at an end of the base sheet 531, and a through hole 535. The base sheet 531 is substantially flat sheet and substantially rectangular and its size is substantially equal to size of the base section 31. The connecting portion 533 is a hollow cylinder, so the connecting pin 35 is rotatably received within the connecting portion 533 to assemble the pivoting members 30 to the assembling sections 53. The through hole 535 corresponds to the locking section 37, and the locking section 37 can removably pass through the through hole 535.

The cushion member 70 is a substantially flat and substantially rectangular sheet and can be made from rubber or other elastic material and may be formed by punching and/or cutting a piece of elastic material. The cushion member 70 is located at the assembling surface 511 of the body sheet 51 and is positioned between the two assembling sections 53. When the electronic device 200 is mounted within the protection mechanism 100, the cushion member 70 is located between the connecting sheet 13 and the electronic device 200 and resists against the electronic device 200. Thus, the cushion member 70 not only has a cushioning effect to avoid impact, also the friction between the cushion member 70 and the electronic device 200 prevents the electronic device 200 from sliding out of the protection mechanism 100.

The electronic device 200 may be an existing flip type portable electronic device and defines two positioning holes 201 located at opposite sides of the electronic device body. When the electronic device 200 is assembled to the protection mechanism 100, the positioning holes 201 are aligned with the through holes 535 and the locking sections 37, which can be inserted into or taken out of the corresponding positioning holes 201.

In assembly, the cushion member 70 is positioned on the body sheet 51 and is located between the assembling sections 53. The connecting pins 35 are rotatably assembled within the corresponding connecting portions 533 to connect the pivoting members 30 to the holding member 50. The locking sections 37 can selectively be inserted into or taken out of the corresponding positioning holes 201 through the through holes 535. The holding member 50 then is positioned on the first cover 11 and is adjacent to the connection sheet 13.

Figure 4:
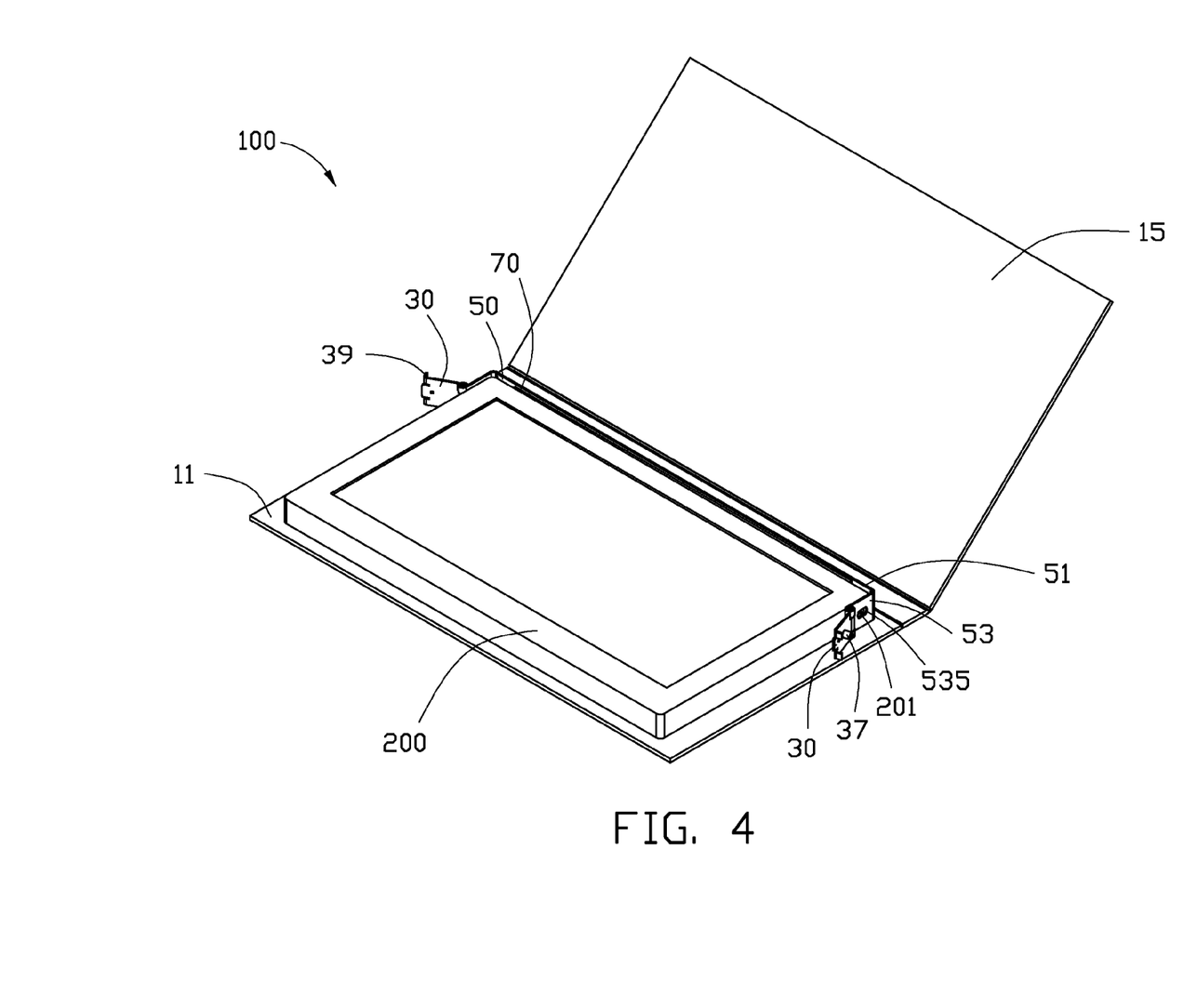
FIG. 4 is a schematic view of the electronic device assembled to the protection mechanism shown in FIG. 2.

Further referring FIG. 4, in use, to assemble the electronic device 200 to the protection mechanism 100, the electronic device 200 is mounted between the assembling sections 53 and resists against the cushion member 70, and the positioning holes 201 are aligned with the through holes 535. Rotating the pivoting members 30 relative to the assembling sections 53 in the direction close to the through holes 535, then the locking sections 37 are inserted into the positioning holes 201 through the through holes 535, and the protrusions 391 are received within the corresponding fixing holes 513. Thereby, the electronic device 200 is latched to the protection mechanism 100.

To unlock the electronic device 200 from the protection mechanism 100, the protrusions 391 are taken out of the corresponding fixing holes 513. The locking sections 37 are then removed out from the corresponding positioning holes 201. Therefore, the electronic device 200 detaches from the protection mechanism 100.

Figure 5:
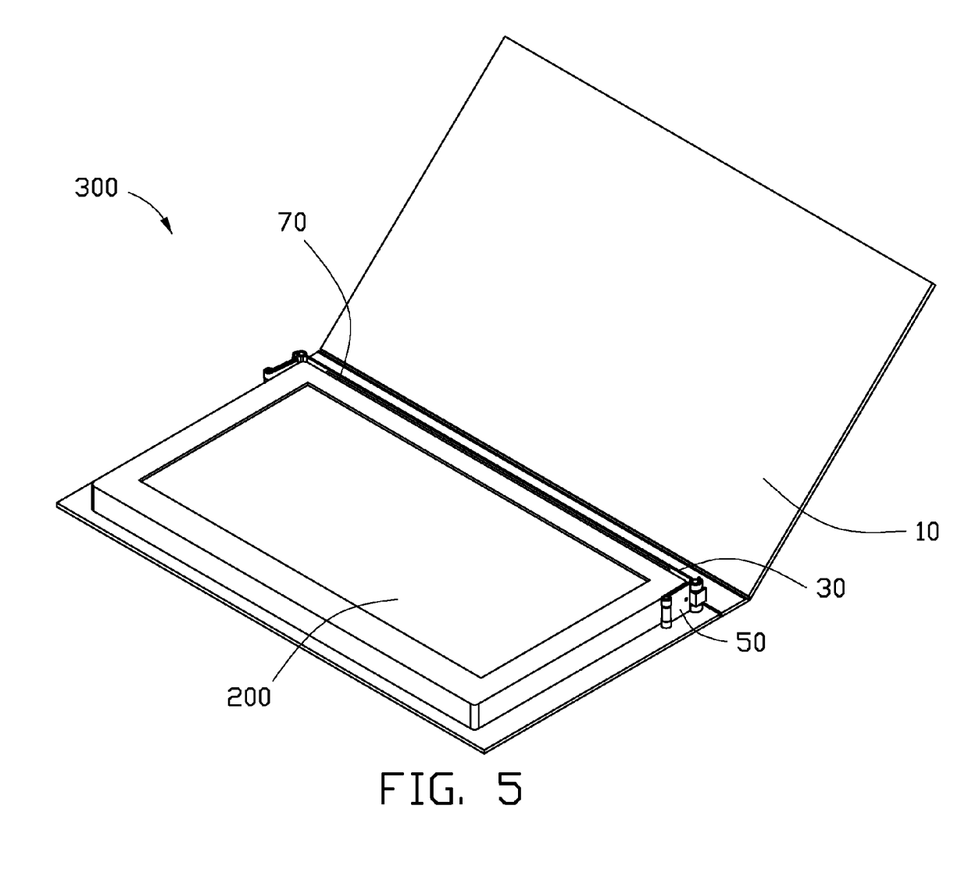
FIG. 5 is a schematic view of a protection mechanism in an open state, exposing an electronic device, according to another exemplary embodiment.
Figure 6:
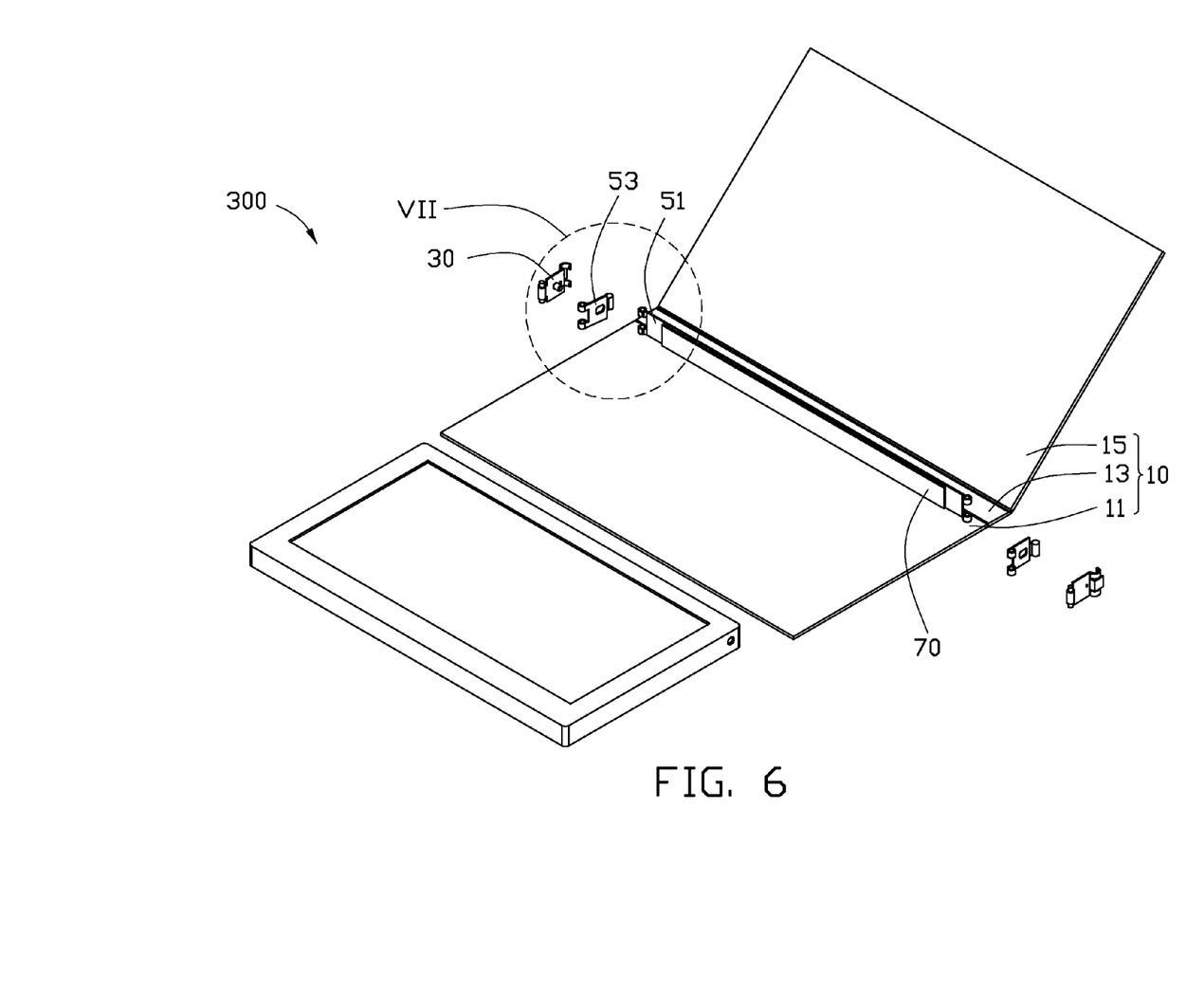
FIG. 6 is a partially exploded view of the protection mechanism shown in FIG. 5.
Figure 7:
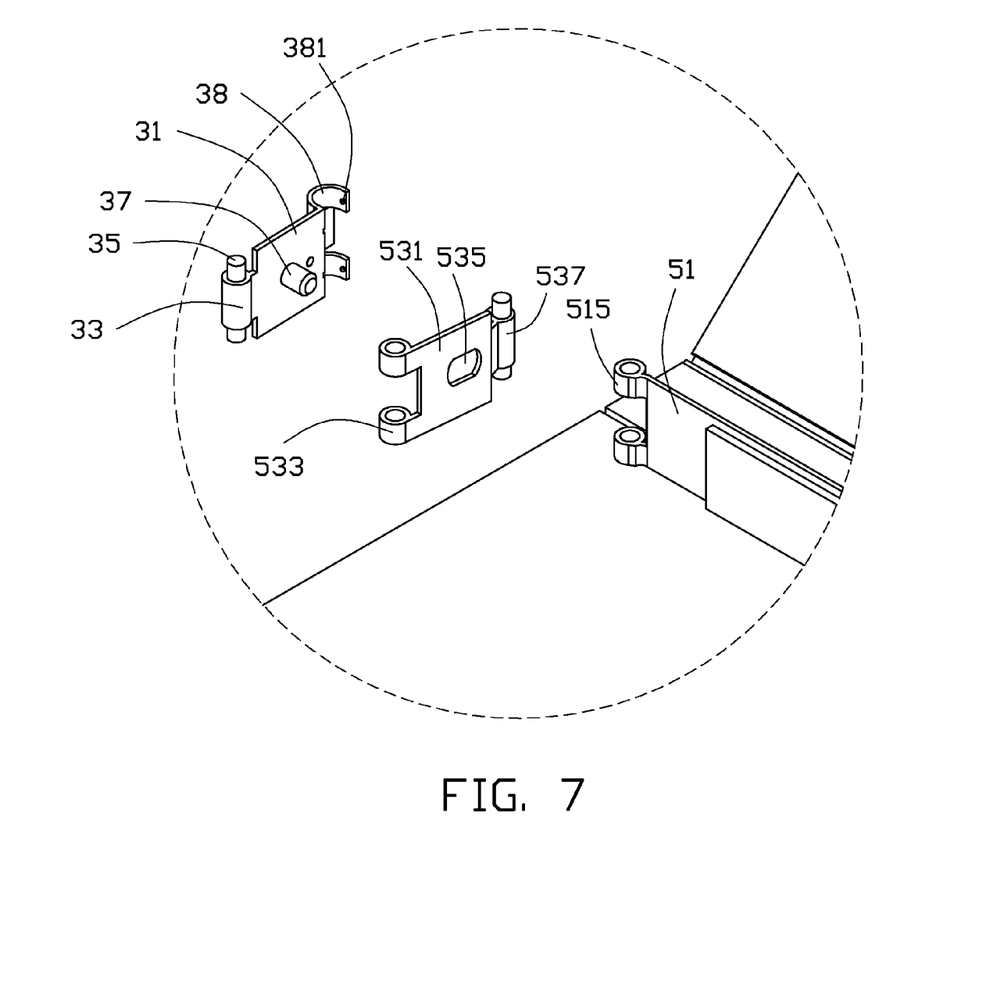
FIG. 7 is an enlarged view of a circled portion VII shown in FIG. 6.

FIGS. 5, 6, and 7 show another exemplary embodiment of a protection mechanism 300 used in the electronic device 200. The protection mechanism 300 has substantially the same configuration as that of the protection mechanism 100 as shown in FIG. 1. The protection mechanism 300 also has the main body 10, the pivoting member 30, the holding member 50, and the cushion member 70 as shown in FIG. 1.

The body sheet 51 includes four hinge sections 515 and two hinge sections 515 are averagely located at each end of the body sheet 51, and the hinge sections 515 are substantially hollow cylinders. Each assembling section 53 includes a hinging barrel 537 opposite to the connecting portion 533, and the hinging barrels 537 are rotatably positioned in the corresponding hinge sections 515 to assemble the assembling sections 53 to the body sheet 51. The pivoting member 30 further includes a substantially semi-annular clasping portion 38, and the clasping portions 38 can receive the corresponding hinge sections 515. The clasping portion 38 includes protrusions 381 protruding from the inner surface of the clasping portion 38, and the protrusions 381 are capable of being releasably received in corresponding fixing holes (not shown) on the body sheet 51.

In assembly, the cushion member 70 is installed on the body sheet 51, and the hinging barrels 537 are rotatably positioned in the hinge sections 515 to assemble the assembling sections 53 to the body sheet 51. The connecting pins 35 are rotatably positioned within the connecting portions 533 to assemble the pivoting members 30 to the assembling sections 53. The locking sections 37 can remove in or out of the through holes 535. Thus, the holding member 50 then is installed on the first cover 11 and is adjacent to the connection sheet 13.

Figure 8:
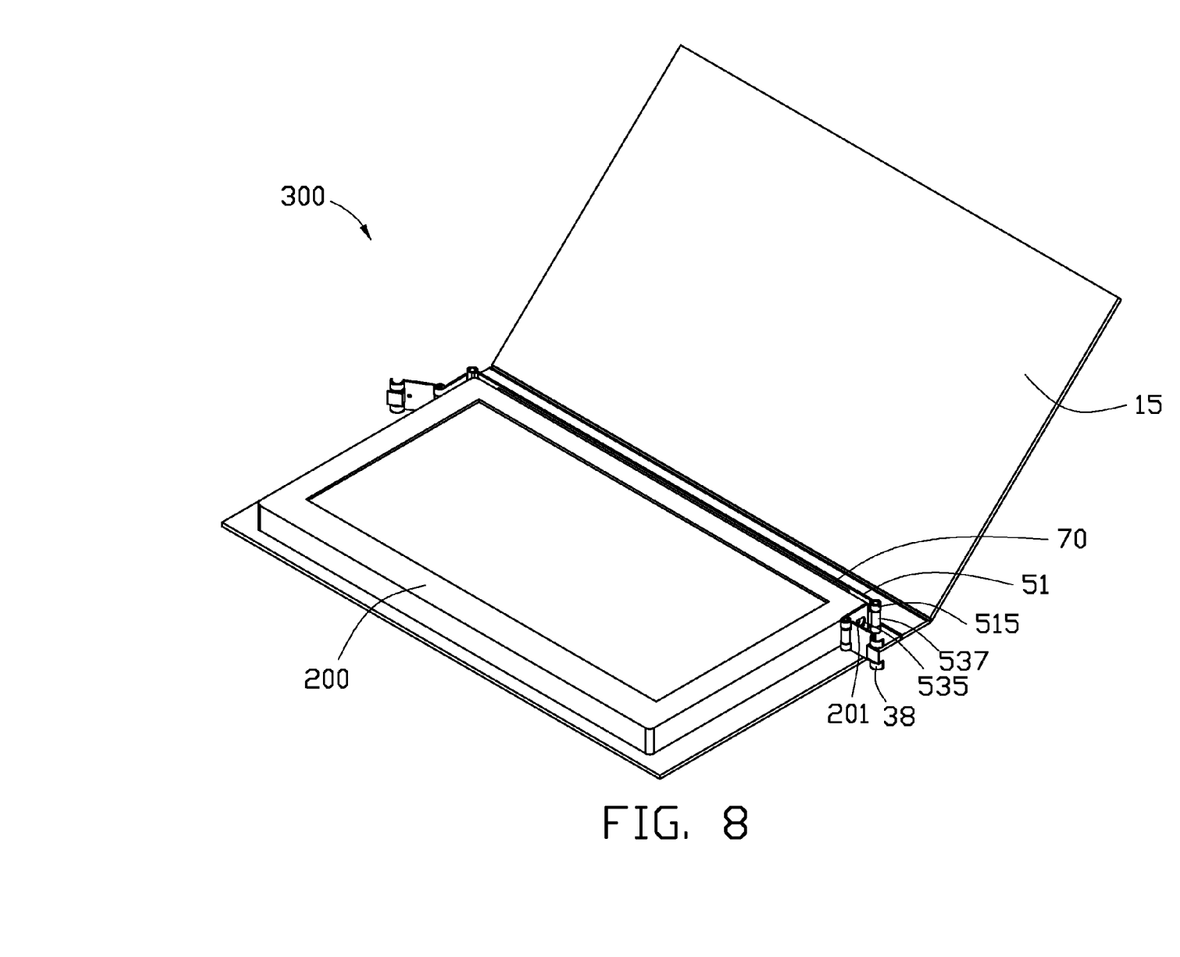
FIG. 8 is a schematic view of the electronic device assembled to the protection mechanism shown in FIG. 6.

Further referring to FIG. 8, in use, to assemble the electronic device 200 to the protection mechanism 300, the electronic device 200 is positioned on the first cover 11 and resists against the cushion member 70. The positioning holes 201 are aligned with the through holes 535. Rotating the pivoting members 30 relative to the assembling sections 53 in the direction close to the electronic device 200, the locking sections 37 then are inserted in the positioning holes 201 through the through holes 535. The hinge sections 515 are received within the clasping portions 38, and the protrusions 381 are received within the corresponding fixing holes of the body sheet 51. Thereby, the electronic device 200 is latched to the protection mechanism 300.

To unlock the electronic device 200 from the protection mechanism 300, the protrusions 381 are unlatched from the corresponding fixing holes of the body sheet 51, and the hinge sections 515 are removed out from the clasping portions 38. Rotating the pivoting member 30 relative to the assembling sections 53, the locking sections 37 are removed out from the corresponding positioning holes 201. Therefore, the electronic device 200 detaches from the protection mechanism 300.

In summary, in the protection mechanism and the electronic device employing the same of the exemplary embodiment, the protection mechanism can simply secure and unlock the electronic device through the pivoting members 30, which is easy to operate. Moreover, the electronic device can not fall out from the protection mechanism because of the cooperation of the pivoting members 30 and the holding member 50.

It is to be understood, however, that even though numerous characteristics and advantages of the exemplary disclosure have been set forth in the foregoing description, together with details of the structure and function of the exemplary disclosure, the disclosure is illustrative only, and changes may be made in detail, especially in matters of shape, size, and arrangement of parts within the principles of exemplary disclosure to the full extent indicated by the broad general meaning of the terms in which the appended claims are expressed.

What is claimed is:

1. A protection mechanism used for in an electronic device, comprising:

a main body for receiving and protecting the electronic device, and the main body comprising a connecting sheet and a first cover rotatable connected to one side of the connecting sheet;

two pivoting members rotatably positioned on the first cover of the main body; and a holding member positioned on the first cover and adjacent to the connecting sheet to secure the electronic device, wherein the holding member comprises two assembling sections, the pivoting members are rotatably assembled to the corresponding assembling sections and are capable of locking the electronic device to the main body.

2. The protection mechanism as claimed in claim 1, wherein the main body further comprises a second cover, the first cover and the second cover are rotatably connected to the opposite sides of the connecting sheet, and the electronic device is positioned on the first cover.

3. The protection mechanism as claimed in claim 2, wherein the holding member further comprises a body sheet and the two assembling sections are substantially perpendicularly connected to opposite ends of the body sheet.

4. The protection mechanism as claimed in claim 3, wherein the pivoting member comprises a base section, a hinge housing located at an end of the base section, and a connecting pin exposed from the hinge housing, the assembling section comprises a base sheet and an connecting portion located at an end of the base sheet, and the connecting pin is rotatably positioned in the hinge housing and is rotatably received within the connecting portion to assemble the pivoting members to the holding member.

5. The protection mechanism as claimed in claim 4, wherein the pivoting member further comprises a locking section protruding from the base section and at least one fixing blocks, each fixing block comprises a protrusion, and the body sheet defines a plurality of fixing holes located at opposite ends of the body sheet, the assembling section defines a through hole, the protrusions are releasably received within the corresponding fixing holes to secure the pivoting members to the holding member, and the locking sections removably pass through the through holes to latch the electronic device to the protection mechanism.

6. The protection mechanism as claimed in claim 4, wherein the body sheet further comprises four hinge sections with two hinge sections located on each end of the body sheet, and each assembling section comprises a hinging barrel, and the hinging barrels are rotatably positioned in the corresponding hinge sections to assemble the assembling sections to the body sheet.

7. A protection mechanism used for in an electronic device, comprising:
a main body for receiving and protecting the electronic device, and the main body comprising a connecting sheet and a first cover rotatably connected to one side of the connecting sheet;
a holding member positioned on the first cover and adjacent to the connecting sheet of the main body to secure the electronic device, and the holding member comprising two assembling sections; and
two pivoting members positioned on the opposite ends of the holding member, wherein the pivoting members rotate relative to the first cover of the main body and are rotatably connected to the corresponding assembling sections of the holding member to lock the electronic device from removal from the protection mechanism.

8. The protection mechanism as claimed in claim 7, wherein the main body further comprises a second cover, the first cover and the second cover are rotatably connected to the opposite sides of the connecting sheet, and the electronic device is positioned on the first cover.

9. The protection mechanism as claimed in claim 8, wherein the holding member further comprises a body sheet and the two assembling sections are substantially perpendicularly connected to opposite ends of the body sheet.

10. The protection mechanism as claimed in claim 9, wherein the pivoting member comprises a base section, a hinge housing located at an end of the base section, and a connecting pin exposed from the hinge housing, the assembling section comprises a base sheet and an connecting portion located at an end of the base sheet, and the connecting pin is rotatably positioned in the hinge housing and is rotatably received within the connecting portion to assemble the pivoting members to the holding member.

11. The protection mechanism as claimed in claim 10, wherein the pivoting member further comprises a locking section protruding from the base section and at least one fixing blocks, each fixing block comprises a protrusion, and the body sheet defines a plurality of fixing holes located at opposite ends of the body sheet, the assembling section defines a through hole, the protrusions are releasably received within the corresponding fixing holes to secure the pivoting members to the holding member, and the locking sections removably pass through the through holes to latch the electronic device to the protection mechanism.

12. The protection mechanism as claimed in claim 10, wherein the body sheet further comprises four hinge sections with two hinges sections located at each end of the body sheet, and each assembling section comprises a hinging barrel, and the hinging barrels are rotatably positioned in the corresponding hinge sections to assemble the assembling sections to the body sheet.

13. The protection mechanism as claimed in claim 9, further comprising a cushion member positioned on the body sheet, and the cushion member is capable of resisting against the electronic device to provide cushioning force.

14. An electronic device, comprising:
an electronic device body defining two positioning holes; and
a protection mechanism used for protecting the electronic device, the protection mechanism comprising:
a main body for receiving the electronic device, and the main body comprising a connecting sheet and a first cover rotatably connected to one side of the connecting sheet;
a holding member positioned on the first cover and adjacent to the connecting sheet to secure the electronic device; and
two pivoting members rotatably positioned on the first cover of the main body, each pivoting member defining locking sections corresponding to the positioning holes, wherein the locking sections are capable of latching within the positioning hole, and the pivoting members are rotatably assembled to the corresponding assembling sections of the holding member to protect the electronic device body from removal from the protection mechanism.

15. The electronic device as claimed in claim 14, wherein the main body further comprises a second cover, the first cover and the second cover are rotatably connected to the opposite sides of the connecting sheet, and the electronic device body is detachably positioned on the first cover.

16. The electronic device as claimed in claim 15, wherein the holding member further comprises a body sheet and the two assembling sections are substantially perpendicularly connected to opposite ends of the body sheet.

17. The electronic device as claimed in claim 16, wherein the pivoting member comprises a base section, a hinge housing located at an end of the base section, and a connecting pin exposed from the hinge housing, the assembling section comprises a base sheet and an connecting portion located at an end of the base sheet, and the connecting pin is rotatably positioned in the hinge housing and is rotatably received within the connecting portion to assemble the pivoting members to the holding member.

18. The electronic device as claimed in claim 17, wherein the pivoting member further comprises at least one fixing blocks, each fixing block protrudes from the base section and comprises a protrusion, and the body sheet defines a plurality of fixing holes located at opposite ends of the body sheet, the assembling section defines a through hole, the protrusions are releasably received within the corresponding fixing holes to secure the pivoting members to the holding member, and the locking sections removably pass through the through holes to latch the electronic device body to the protection mechanism.

19. The electronic device as claimed in claim 17, wherein the body sheet further comprises four hinge sections with two hinge sections located at each end of the body sheet, and each assembling section comprises a hinging barrel, and the hinging barrels are rotatably positioned in the corresponding hinge sections to assemble the assembling sections to the body sheet.

20. The electronic device as claimed in claim 16, wherein the electronic device further comprises an cushion member positioned on the body sheet, and the cushion member is located between the connecting sheet and the electronic device body and resists against the electronic device body to prevent the electronic device body from sliding from the protection mechanism.

* * * * *